United States Patent
Niimi et al.

(10) Patent No.: US 10,818,599 B2
(45) Date of Patent: Oct. 27, 2020

(54) HYBRID SOURCE AND DRAIN CONTACT FORMATION USING METAL LINER AND METAL INSULATOR SEMICONDUCTOR CONTACTS

(71) Applicants: INTERNATIONAL BUSINESS MACHINES CORPORATION, Armonk, NY (US); GLOBALFOUNDRIES INC., Cayman Islands (KY)

(72) Inventors: Hiroaki Niimi, Cohoes, NY (US); Shariq Siddiqui, Albany, NY (US); Tenko Yamashita, Schenectady, NY (US)

(73) Assignees: INTERNATIONAL BUSINESS MACHINES CORPORATION, Armonk, NY (US); GLOBALFOUNDRIES INC. (KY)

( * ) Notice: Subject to any disclaimer, the term of this patent is extended or adjusted under 35 U.S.C. 154(b) by 0 days.

(21) Appl. No.: 16/237,685

(22) Filed: Jan. 1, 2019

(65) Prior Publication Data
US 2019/0157413 A1    May 23, 2019

Related U.S. Application Data

(63) Continuation of application No. 15/792,206, filed on Oct. 24, 2017, now Pat. No. 10,170,574, which is a
(Continued)

(51) Int. Cl.
*H01L 29/78* (2006.01)
*H01L 29/45* (2006.01)
(Continued)

(52) U.S. Cl.
CPC .. *H01L 23/53266* (2013.01); *H01L 21/02244* (2013.01); *H01L 21/28512* (2013.01);
(Continued)

(58) Field of Classification Search
CPC ......... H01L 21/76843; H01L 21/28518; H01L 21/76855; H01L 21/823814;
(Continued)

(56) References Cited

U.S. PATENT DOCUMENTS 6,703,648 B1    3/2004    Xiang et al.
7,718,500 B2    5/2010    Chong et al.
(Continued)

OTHER PUBLICATIONS

List of IBM Patents or Patent Applications Treated as Related dated Jan. 1, 2019, 2 pages.
(Continued)

*Primary Examiner* — Errol V Fernandes
*Assistant Examiner* — Jeremy J Joy
(74) *Attorney, Agent, or Firm* — Tutunjian & Bitetto, P.C.; Vazken Alexanian

(57) ABSTRACT

An electrical device including a first semiconductor device having a silicon and germanium containing source and drain region, and a second semiconductor device having a silicon containing source and drain region. A first device contact to at least one of said silicon and germanium containing source and drain region of the first semiconductor device including a metal liner of an aluminum titanium and silicon alloy and a first tungsten fill. A second device contact is in contact with at least one of the silicon containing source and drain region of the second semiconductor device including a material stack of a titanium oxide layer and a titanium layer. The second device contact may further include a second tungsten fill.

9 Claims, 8 Drawing Sheets

Related U.S. Application Data continuation of application No. 15/272,919, filed on Sep. 22, 2016, now Pat. No. 9,853,115, which is a continuation of application No. 14/930,933, filed on Nov. 3, 2015, now Pat. No. 9,484,255.

(51) Int. Cl.

| | | |
|---|---|---|
| *H01L 29/417* | (2006.01) | |
| *H01L 29/161* | (2006.01) | |
| *H01L 29/08* | (2006.01) | |
| *H01L 27/092* | (2006.01) | |
| *H01L 23/535* | (2006.01) | |
| *H01L 23/532* | (2006.01) | |
| *H01L 23/485* | (2006.01) | |
| *H01L 21/8238* | (2006.01) | |
| *H01L 21/768* | (2006.01) | |
| *H01L 21/3213* | (2006.01) | |
| *H01L 21/285* | (2006.01) | |
| *H01L 21/02* | (2006.01) | |
| H01L 29/66 | (2006.01) | |
| H01L 29/165 | (2006.01) | |

(52) U.S. Cl.
CPC .. *H01L 21/28518* (2013.01); *H01L 21/28568* (2013.01); *H01L 21/32134* (2013.01); *H01L 21/32136* (2013.01); *H01L 21/7684* (2013.01); *H01L 21/7685* (2013.01); *H01L 21/76814* (2013.01); *H01L 21/76831* (2013.01); *H01L 21/76843* (2013.01); *H01L 21/76846* (2013.01); *H01L 21/76855* (2013.01); *H01L 21/76858* (2013.01); *H01L 21/76865* (2013.01); *H01L 21/76877* (2013.01); *H01L 21/76879* (2013.01); *H01L 21/76895* (2013.01); *H01L 21/823814* (2013.01); *H01L 21/823871* (2013.01); *H01L 23/485* (2013.01); *H01L 23/535* (2013.01); *H01L 23/53238* (2013.01); *H01L 27/092* (2013.01); *H01L 29/0847* (2013.01); *H01L 29/161* (2013.01); *H01L 29/41725* (2013.01); *H01L 29/45* (2013.01); *H01L 29/7848* (2013.01); *H01L 21/02252* (2013.01); *H01L 21/02255* (2013.01); *H01L 21/2855* (2013.01); *H01L 21/28556* (2013.01); *H01L 23/53223* (2013.01); *H01L 23/53252* (2013.01); *H01L 29/165* (2013.01); *H01L 29/41783* (2013.01); *H01L 29/665* (2013.01); *H01L 29/66628* (2013.01)

(58) Field of Classification Search
CPC ....... H01L 21/76831; H01L 21/823871; H01L 21/76814; H01L 21/76846; H01L 23/485; H01L 23/53238; H01L 23/53266; H01L 29/7848; H01L 29/665; H01L 29/66636
See application file for complete search history.

(56) References Cited

U.S. PATENT DOCUMENTS

| | | | |
|---|---|---|---|
| 8,148,786 B2 | 4/2012 | Kavalieros et al. | |
| 9,391,152 B1* | 7/2016 | Chen | H01L 29/45 |
| 2006/0220141 A1* | 10/2006 | Besser | H01L 21/823871 |
| | | | 257/371 |
| 2008/0064205 A1* | 3/2008 | Dominguez | C23C 16/342 |
| | | | 438/653 |
| 2008/0237603 A1* | 10/2008 | Lodha | H01L 21/28518 |
| | | | 257/69 |
| 2009/0022958 A1* | 1/2009 | Plombon | H01L 21/76828 |
| | | | 428/164 |
| 2010/0197089 A1* | 8/2010 | Kim | H01L 23/53266 |
| | | | 438/199 |
| 2012/0032275 A1* | 2/2012 | Haran | H01L 21/76829 |
| | | | 257/401 |
| 2013/0214363 A1* | 8/2013 | Nemouchi | H01L 21/823807 |
| | | | 257/369 |
| 2014/0065819 A1* | 3/2014 | Ahmed | H01L 21/28052 |
| | | | 438/664 |
| 2014/0084340 A1* | 3/2014 | Wang | H01L 29/0684 |
| | | | 257/190 |
| 2014/0124842 A1 | 5/2014 | Wang et al. | |
| 2014/0264494 A1* | 9/2014 | Xu | H01L 29/41725 |
| | | | 257/288 |
| 2014/0264634 A1 | 9/2014 | Lee | |
| 2014/0264825 A1 | 9/2014 | Ahmed | |
| 2014/0273366 A1* | 9/2014 | Lin | H01L 21/28518 |
| | | | 438/200 |
| 2014/0361376 A1 | 12/2014 | Lii | |
| 2015/0179579 A1* | 6/2015 | Jezewski | H01L 21/76882 |
| | | | 257/753 |
| 2015/0243565 A1* | 8/2015 | Nieh | H01L 21/823871 |
| | | | 257/369 |
| 2015/0243663 A1* | 8/2015 | Hung | H01L 21/823821 |
| | | | 257/365 |
| 2015/0270168 A1* | 9/2015 | Breil | H01L 21/285 |
| | | | 257/757 |
| 2015/0270178 A1* | 9/2015 | Alptekin | H01L 21/823871 |
| | | | 257/288 |
| 2015/0270179 A1* | 9/2015 | Alptekin | H01L 21/28512 |
| | | | 257/757 |
| 2015/0325473 A1* | 11/2015 | Niimi | H01L 21/823431 |
| | | | 257/774 |
| 2016/0056054 A1* | 2/2016 | Takahashi | H01L 21/324 |
| | | | 438/754 |

OTHER PUBLICATIONS

Agrawal, A. et al., "A unified model for insulator selection to form ultra-low resistivity metal-insulator-semiconductor contacts to n-Si, n-Ge, and n-InGaAs" Applied Physics Letters (2012) pp. 042108-1-042108-4, vol. 101.
Chen, Y.C. et al., "Implantation Formed Metal-Insulator-Semiconductor (MIS) Contracts" U.S. Appl. No. 14/600,077, filed Jan. 20, 2015.
List of IBM Patents or Patent Applications Treated as Related dated Oct. 24, 2017, 2 pages.

\* cited by examiner

US 10,818,599 B2

HYBRID SOURCE AND DRAIN CONTACT FORMATION USING METAL LINER AND METAL INSULATOR SEMICONDUCTOR CONTACTS

BACKGROUND

Technical Field

The present disclosure relates to electrical devices, such as semiconductor devices. The present disclosure further relates to processing of materials suitable for the contacts to semiconductor devices.

Description of the Related Art

Semiconductor field effect transistors (FETs) continue to get smaller because of technological improvements in semiconductor fabrication processes. The technological improvements have enabled aggressive down-scaling of FETs, and the aggressive down-scaling has resulted in increased density of electrical components on integrated circuits. However, as FETs get smaller, challenges arise that can negatively impact their utility and performance. One challenge often encountered in semiconductor fabrication, which arises due to down-scaling of FETs, is the ability to provide FETs with low source/drain (S/D) contact resistance. A contact is an interface material between a FET substrate and interconnect wiring, wherein the interconnect wiring is routed to connect a FET to other integrated circuit components distributed on the surface of the substrate. A source/drain contact can enhance electrical current flow (i.e., reduce resistance) between substrate and interconnect wiring. However, as surface area of contacts decrease, due to the aggressive down-scaling, contact resistance can increase and cause a reduction of FET performance, such as a reduction in transistor switching speed.

SUMMARY

In one embodiment, the present disclosure provides a method of forming contacts to an electrical device including semiconductor devices composed of silicon and silicon germanium materials. In one embodiment, the method includes providing a first via to a first semiconductor device comprising at least one of a silicon and germanium containing source and drain region and providing a second via to a second semiconductor device comprising at least one of a silicon containing source and drain region. A material stack is formed in the first and second via, the first material stack comprising a titanium layer and an aluminum layer. Forming a mask protecting the first via. Converting the aluminum layer of the first material stack within the second vial to aluminum oxide. Removing the aluminum oxide with an etch that is selective to the titanium layer. Converting the titanium layer present in the second via to titanium oxide with an oxidation anneal, wherein during said oxidation anneal the aluminum layer in the first via alloys with the titanium layer and silicon from the silicon containing source and drain region. A metal layer is deposited in the second via. Tungsten fills at least one of the first and second via.

In another embodiment, the method includes providing a first via to a first semiconductor device comprising at least one of a silicon and germanium containing source and drain region and providing a second via to a second semiconductor device comprising at least one of a silicon containing source and drain region. A material stack is formed in the first and second via, the first material stack comprising a titanium layer at a base of said first and second via, an aluminum layer on the titanium layer, and a tungsten fill. The tungsten fill and the aluminum layer is removed from the second via. The titanium layer present in the second via is converted to titanium oxide with an oxidation anneal, wherein during said oxidation anneal the aluminum layer in the first via alloys with the titanium layer and silicon from the silicon containing source and drain region. A titanium layer is deposited in the second via. Tungsten is deposited in the second via.

In another aspect, an electrical device is provided that includes a first semiconductor device present in a first region of a substrate, the first semiconductor device including at least one of a silicon and germanium containing source and drain region; and a second semiconductor device in a second region of a substrate, the second semiconductor device including at least one of a silicon containing source and drain region. A first device contact to at least one of said silicon and germanium containing source and drain region of the first semiconductor device, the first device contact including a metal liner of an aluminum titanium and silicon alloy at a base of the first device contact and a first tungsten fill. A second device contact to at least one of the silicon containing source and drain region of the second semiconductor device, the second device contact comprising a material stack of a titanium oxide layer at the base of the second device contact and a titanium layer atop the titanium oxide layer. The second device contact may further include a second tungsten fill.

BRIEF DESCRIPTION OF DRAWINGS

The following detailed description, given by way of example and not intended to limit the disclosure solely thereto, will best be appreciated in conjunction with the accompanying drawings, wherein like reference numerals denote like elements and parts, in which.

DETAILED DESCRIPTION OF THE PREFERRED EMBODIMENTS

Figure 1:
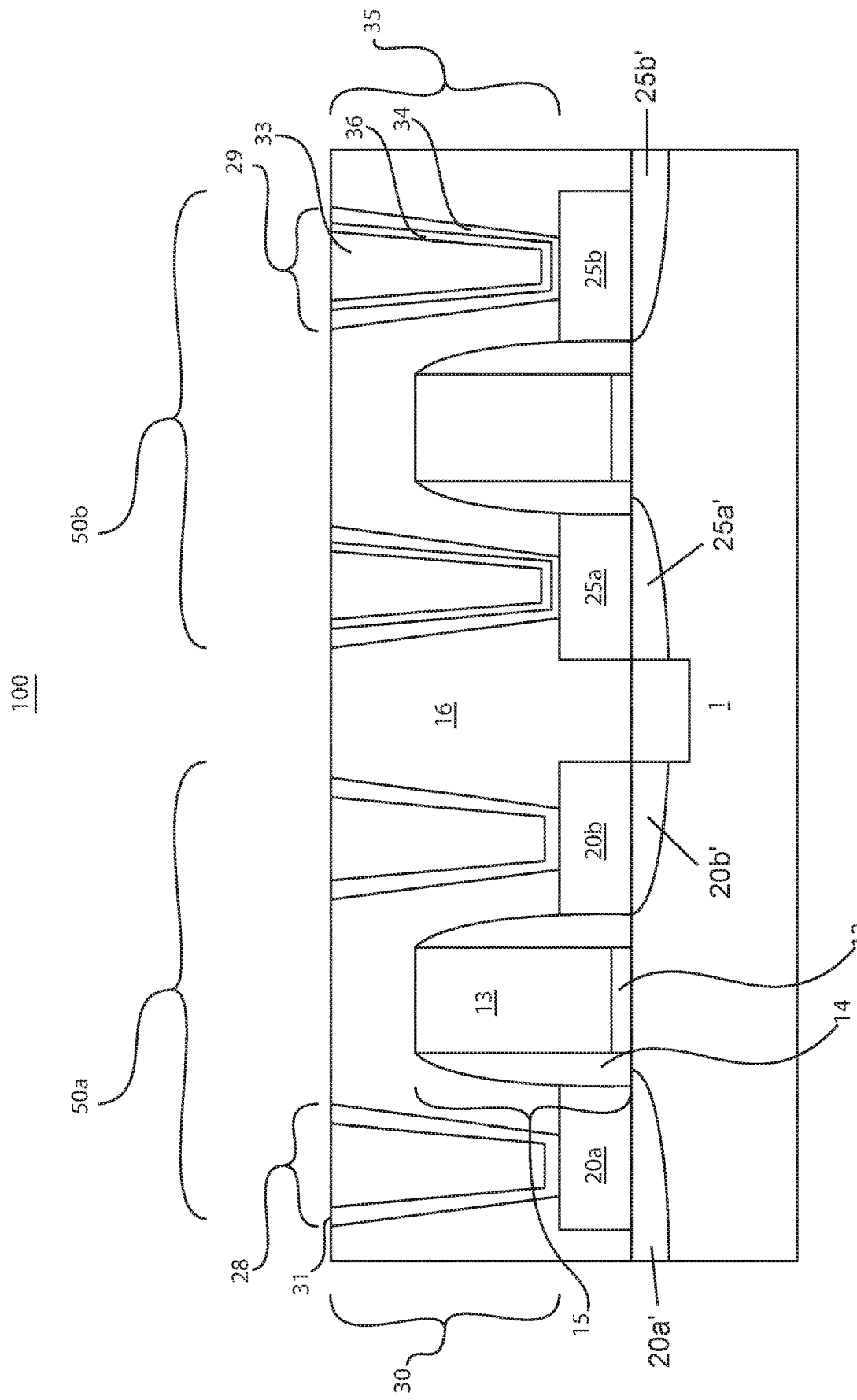
FIG. 1 is a side cross-sectional view depicting one embodiment of source and drain contacts to semiconductor devices, in accordance with present disclosure.

Detailed embodiments of the claimed structures and methods are disclosed herein; however, it is to be understood that the disclosed embodiments are merely illustrative of the claimed structures and methods that may be embodied in various forms. In addition, each of the examples given in connection with the various embodiments is intended to be illustrative, and not restrictive. Further, the figures are not necessarily to scale, some features may be exaggerated to show details of particular components. Therefore, specific structural and functional details disclosed herein are not to be interpreted as limiting, but merely as a representative basis for teaching one skilled in the art to variously employ the methods and structures of the present disclosure. For purposes of the description hereinafter, the terms "upper", "lower", "right", "left", "vertical", "horizontal", "top", "bottom", and derivatives thereof shall relate to the embodiments of the disclosure, as it is oriented in the drawing figures. The terms "positioned on" means that a first element, such as a first structure, is present on a second element, such as a second structure, wherein intervening elements, such as an interface structure, e.g. interface layer, may be present between the first element and the second element. The term "direct contact" means that a first element, such as a first structure, and a second element, such as a second structure, are connected without any intermediary conducting, insulating or semiconductor layers at the interface of the two elements.

In some embodiments, the methods and structures disclosed herein provide for low defect contacts to semiconductor devices, which also have suitable contact resistivity. Nickel silicide contacts typically have a low contact resistivity, but is susceptible to nickel silicide (NiSi) "pipe" defect generation, which can be present under sidewalls of the gate structures of semiconductor devices, which can cause source and drain region short that result in yield loss, e.g., static random access memory (SRAM) device yield loss. Titanium silicide contacts, unlike nickel silicide, do not generate defects, such as pipe defects, but the high contact resistivity of titanium silicide can reduce device performance due to a higher contact resistance. In some examples, because titanium silicide ($TiSi_x$) is an n-type metal, this can be an issue for the source and contacts to p-type semiconductor devices.

In some embodiments, the methods and structures provided herein provide a metal-insulator-semiconductor (MIS) contact in which Fermi level pinning is released, and the effective Schottky barrier height is reduced. This is one of methods to reduce contact resistivity for semiconductor devices. Titanium oxide ($TiO_2$) is one example of an insulating material suitable for metal insulator semiconductor (MIS) contact, in accordance with the methods and structures disclosed herein. In some embodiments, because the conduction band off-set between titanium oxide ($TiO_2$) and semiconductors, such as silicon (Si) and germanium (Ge), is small, a wide process margin is provided by the methods disclosed herein to optimize contact resistivity, especially with respect to insulator thickness. In some embodiments, the methods and structures disclosed herein can provide a hybrid contact liner scheme. For example, a metal silicide comprising an Al—Ti—Si alloy on a silicon and germanium containing, e.g., silicon germanium (SiGe), contact surface may provide the electrical contact to the source and drain regions of a p-type field effect transistor (PFET); and the electrical contact to the silicon containing, e.g., silicon (Si), contact surface of the source and drain regions of an n-type field effect transistor (NFET) may be provided by a titanium oxide ($TiO_2$) and titanium layered material stack. As will be described in further detail below, some steps for implementing the aforementioned hybrid contact liner scheme include forming the material layers for providing an aluminum titanium and silicon (Al—Ti—Si) alloy metal in first via openings to the p-type semiconductor devices, and then removing and/or modifying the same material layers in second via openings to form the titanium oxide and titanium material layer stack in the second via opening to the source and drain regions of the n-type semiconductor devices. For example, the aluminum layer in the second via opening is converted to aluminum oxide to etch the oxide from the titanium selectively, which minimizes trench widening. Thereafter, in some embodiments, the titanium layer is treated with an oxygen containing plasma to form titanium oxide, and a titanium layer can be deposited atop the titanium oxide layer to provide the titanium oxide ($TiO_2$) and titanium layered material stack within the second via opening to the n-type field effect transistor (NFET). The methods and structures of the present disclosure are now described with greater detail referring to FIGS. 1-8B.

FIG. 1 depicts one embodiment of an electrical device 100 including semiconductor devices 50a, 50b having contacts formed using a hybrid contact liner scheme that includes a metal insulator semiconductor (MIS) contact. As used herein, the term "semiconductor device" refers to an intrinsic semiconductor material that has been doped, that is, into which a doping agent has been introduced, giving it different electrical properties than the intrinsic semiconductor. Doping involves adding dopant atoms to an intrinsic semiconductor, which changes the electron and hole carrier concentrations of the intrinsic semiconductor at thermal equilibrium. Dominant carrier concentration in an extrinsic semiconductor determines the conductivity type of the semiconductor. A field effect transistor (FET) is a semiconductor device in which output current, i.e., source-drain current, is controlled by the voltage applied to a gate structure to the semiconductor device. A field effect transistor has three terminals, i.e., gate structure, source region and drain region. In some examples, the field effect transistor may be a planar device. In a planar device the gate structure is formed atop an upper surface of the substrate that provides the channel region of the device, in which source and drain regions are present on the substrate on opposing sides of the channel region. FIG. 1 depicts one embodiment of the present disclosure that employs planar semiconductor devices, i.e., planar field effect transistors, e.g., an p-type field effect transistor 50a and an n-type field effect transistor 50b. In other embodiments, the semiconductor device may be a FinFET semiconductor device. In a FinFET semiconductor device the channel region of the semiconductor device is present in a fin structure. As used herein, a "fin structure" refers to a semiconductor material, which is employed as the body of a semiconductor device, in which the gate structure is positioned around the fin structure such that charge flows down the channel on the two sidewalls of the fin structure and optionally along the top surface of the fin structure. Any semiconductor device may provide the contact surface that the contacts are formed to. For example, the semiconductor device may be a planar FET or may be a bipolar junction transistor. In other examples, it is not necessary that the contacts disclosed herein are formed to semiconductor devices, as any electrical device is suitable for use with the methods and structures disclosed herein, such as memory devices, e.g., RAM, MRAM and flash memory, and passive devices, e.g., resistors and capacitors.

Referring to FIG. 1, in one embodiment, the electrical device 100 may include a first semiconductor device 50a present in a first region of a substrate 1, and a second semiconductor device 50b that is present in a second region of the substrate 1. The first semiconductor device 50a includes at least one of a silicon and germanium containing source region 20a, and a silicon and germanium containing drain region 20b. The second semiconductor device 50b includes at least one of a silicon containing source region 25a and a silicon containing drain region 25b. As used herein, the term "drain" means a doped region in semiconductor device located at the end of the channel region, in which carriers are flowing out of the transistor through the drain. The term "source" is a doped region in the semiconductor device, in which majority carriers are flowing into the channel region.

The silicon and germanium containing source and drain regions 20a, 20b for the first semiconductor device 50a can be composed of silicon germanium (SiGe). But, the silicon and germanium containing source and drain regions 20a, 20b are not limited to only silicon germanium (SiGe). In some embodiments, the germanium content of the silicon and germanium containing source and drain regions 20a, 20b may range from 5% to 70%, by atomic weight %. In some embodiments, the germanium (Ge) content of the silicon and germanium containing source and drain regions 20a, 20b may be greater than 20 at. %. In other embodiments, the germanium (Ge) content of the silicon and germanium containing source and drain regions 20a, 20b ranges from 20 at. % to 100 at. %. In another embodiment, the germanium content of the silicon and germanium containing source and drain regions 20a, 20b may range from 10% to 40%. Examples of materials suitable for the silicon and germanium containing source and drain regions 20a, 20b include silicon germanium (SiGe), silicon germanium doped with carbon (SiGe:C), hydrogenated silicon germanium and combinations thereof.

The silicon containing source and drain regions 25a, 25b of the second semiconductor device 50b are typically germanium free. As used herein, the term "silicon containing" in combination with "germanium free", as used to describe a semiconductor material, means a material layer of silicon that is substantially free of germanium. In some embodiments, by being substantially free of germanium, it is meant that the germanium content is less than 5 at. %. For example, the germanium content may be less than 1 at. %, and in some examples, the silicon including semiconductor substrate and/or silicon including fin structures 5 may be entirely free of germanium (Ge). In some embodiments, the silicon including material that provides the source and drain regions 25a, 25b of the second semiconductor device 50b may include, but is not limited to, silicon, single crystal silicon, multicrystalline silicon, polycrystalline silicon, amorphous silicon, strained silicon, silicon doped with carbon (Si:C), silicon alloys or any combination thereof. In one example, the source and drain regions 25a, 25b of the second semiconductor device 50b are composed of greater than 99 at. % silicon (Si), e.g, 100 at. % silicon (Si).

The source and drain regions 20a, 20b, 25a, 25b are typically doped to a conductivity type that provides the conductivity type of the semiconductor device 50a, 50b. For example, the source region 20a and drain region 20b of the first semiconductor device 50a may be doped p-type to provide an p-type field effect transistor (FET), and the source region 25a and drain region 25b of the second semiconductor device 50b may be doped n-type to provide an n-type field effect transistor (FET). As used herein, "p-type" refers to the addition of impurities to an intrinsic semiconductor that creates deficiencies of valence electrons. In a type IV semiconductor, such as silicon and/or germanium, examples of p-type dopants, i.e., impurities, include but are not limited to, boron, aluminum, gallium and indium. As used herein, "n-type" refers to the addition of impurities that contributes free electrons to an intrinsic semiconductor. In a type IV semiconductor, such as silicon and germanium, examples of n-type dopants, i.e., impurities, include but are not limited to antimony, arsenic and phosphorous. The dopant for the epitaxial semiconductor material that dictates the conductivity type of the source and drain regions 20a, 20b is typically present in a concentration ranging from 1E17 atoms/cm$^3$ to 5E21 atoms/cm$^3$.

In the embodiment that is depicted in FIG. 1, the source and drain regions 20a, 20b, 25a, 25b are raised source and drain regions composed of an epitaxial semiconductor material that is formed on an upper surface of the semiconductor substrate 1 on opposing sides of the gate structure 15 that is present on the channel region of the device. In this example, the source and drain regions may further include extension regions 20a', 20b', 25a', 25b' that extend into the semiconductor substrate 1 having a same conductivity type dopant as the raised source and drain regions 20a, 20b, 25a, 25b.

In one example, the source and drain regions 20a, 20b of the first semiconductor device 50a are composed of silicon germanium (SiGe) that is doped with boron (B) at a concentration of $5 \times 10^{20}$ dopants/cm$^3$, and the source and drain regions 25a, 25b of the second semiconductor device 50b are composed of silicon (Si) that is doped with phosphorus (P) at a concentration of $5 \times 10^{20}$ dopants/cm$^3$.

Each of the semiconductor devices 50a, 50b may include a gate structure 15 including a gate dielectric 12 and a gate conductor 13 that is composed of poly-silicon and/or metal layer. The gate dielectric layer 12 can comprise an oxide, such as silicon dioxide, hafnium oxide, zirconium oxide, or a combination thereof, such as hafnium oxide disposed on silicon dioxide. The gate conductor 13 can comprise a metal layer that can include, but is not limited to, aluminum (Al), hafnium (Hf), lanthanum (La), tantalum (Ta), titanium (Ti), or zirconium (Zr). A gate dielectric spacer 14 may be present on the sidewalls of the gate structure 15. The gate dielectric spacer 14 can comprise nitride, oxide, or any other dielectric material. In some embodiments, the gate structure can include a work function metal 12a. The work function metal may include a TiN/TiC/TiN multilayer.

Still referring to FIG. 1, an interlevel dielectric layer 16 may be present on the first and second semiconductor devices 50a, 50b including a first via opening 28 for housing the first device contact 30 to at least one of said silicon and germanium containing source and drain region 20a, 20b of the first semiconductor device 50a, and a second via opening 29 for housing the second device contact 35 to at least one of said silicon containing source and drain region 25a, 25b of the second semiconductor device 50b. The interlevel dielectric layer 15 may be selected from the group consisting of silicon containing materials such as SiO$_2$, Si$_3$N$_4$, SiO$_x$N$_y$, SiC, SiCO, SiCOH, SiBCN and SiCH compounds, carbon doped oxides, inorganic oxides, inorganic polymers, organic polymers such as polyamides or SiLK™, other carbon containing materials, organo-inorganic materials such as spin-on glasses and silsesquioxane-based materials, and diamond-like carbon (DLC), as well as combinations thereof.

The first device contact 30 to at least one of the silicon and germanium containing source and drain region 20a, 20b of the first semiconductor device 50a may include a metal liner 31 of an aluminum, titanium and silicon alloy at a base of the first device contact 20 and a first metal fill, such as a tungsten (W) fill. In one embodiment, the aluminum content of the aluminum, titanium and silicon alloy that provides the metal liner 31 may range from 30 wt. % to 70 wt %. In one embodiment, the titanium content of the aluminum, titanium and silicon alloy that provides the metal liner 31 may range from 30 wt. % to 70 wt. %. In one embodiment, the silicon content of the aluminum, titanium and silicon alloy that provides the metal liner 31 may range from 5 wt. % to 10 wt. %. The metal liner 31 is typically a conformal layer that is present on sidewalls of the first via opening 28 and the base of the first via opening 21 directly on a surface of the silicon and germanium source or drain region 20a, 20b. The term "conformal" denotes a layer having a thickness that does not deviate from greater than or less than 30% of an average value for the thickness of the layer. The metal liner 31 of the aluminum, titanium and silicon alloy typically has a thickness ranging from 1 nm to 10 nm. In one embodiment, the metal liner 31 of the aluminum, titanium and silicon alloy has a thickness ranging from 2 nm to 5 nm. In one example, the metal liner 31 of the aluminum, titanium and silicon alloy has a thickness of 3 nm.

A metal fill 32 is present on, e.g., in direct contact, with the metal liner 21 of the aluminum, titanium and silicon alloy, and typically fills the first via opening 28. In one example, the metal fill 32 is composed of tungsten (W). It is noted that tungsten (W) is only one example of an electrically conductive material that is suitable for the metal fill 32. In other embodiments, the metal fill 32 may be composed of copper (Cu), aluminum (Al), platinum (Pt), titanium (Ti), silver (Ag), gold (Au) or an alloy or multi-layered combination of the aforementioned electrically conductive metals.

In one embodiment, the first device contact 30 is composed of a metal liner 31 of an aluminum, titanium and silicon alloy and a tungsten fill 32 that completely fills the first via opening 28, in which the metal liner 31 is in direct contact with a boron doped p-type silicon germanium source/drain region.

The second device contact 35 to at least one of the silicon containing source and drain region 25a, 25b of the second semiconductor device 50b may include a material stack of a titanium oxide layer 34 at the base of the second device contact 35 and a metal layer 36 atop the titanium oxide layer 34, wherein the second device contact 35 may further include a metal fill 33. In one embodiment, the titanium oxide layer 34 is present on the sidewalls of the second via opening 29 and the base of the second via opening 20, wherein the titanium oxide layer 34 may be in direct contact with a surface of the silicon containing source and drain region 25a, 25b is typically composed of a material that has been formed by treating a deposited titanium metal layer to an oxygen containing plasma. The titanium oxide layer 34 is typically a conformal layer. The titanium oxide layer 34 can be a continuous layer within the second via opening 29. In one embodiment, the titanium oxide layer 34 has a thickness ranging from 1 nm to 10 nm. In one embodiment, the titanium oxide layer 34 has a thickness ranging from 2 nm to 5 nm. In one example, the titanium oxide layer 34 has a thickness of 3 nm.

The metal layer 36 of the second device contact 35 may be in direct contact with the titanium oxide layer 34. In some embodiments, the metal layer 36 may be a conformal material layer. In some embodiments, the metal layer 36 in present over the sidewalls of the second via opening 29 directly on the portion of the titanium oxide layer 34 that is present on the sidewalls of the second via opening 29, and the metal layer 36 is present directly on the titanium oxide layer 34 at the base of the second via opening 29. The metal layer 36 may be a continuous layer. In one embodiment, the metal layer 36 is composed of titanium (Ti). The metal layer 36 may be composed substantially entirely of titanium. For example, the metal layer 36 may be greater than 95 wt. % titanium (Ti). In other embodiments, the metal layer 36 may be equal to 99 wt. % titanium (Ti), and the metal layer 36 can be 100 wt. % titanium. It is noted that the above titanium compositions for the metal layer 36 are provided for illustrative purposes, and are not intended to limit the present disclosure. For example, in some other embodiments, the metal layer 36 may be composed of aluminum (Al), titanium (Ti), copper (Cu), tungsten (W), gold (Au), silver (Ag), or an alloy thereof, or a multilayer combination thereof. The metal layer 36 can have a thickness ranging from 1 nm to 10 nm. In one embodiment, the metal layer 36 has a thickness ranging from 2 nm to 5 nm. In one example, the metal layer 36 has a thickness of 3 nm.

A metal fill 33 may be present on, e.g., in direct contact, with the metal layer 36, and typically fills the second via opening 29 containing the second device contact 35. In one example, the metal fill 33 is composed of tungsten (W). It is noted that tungsten (W) is only one example of an electrically conductive material that is suitable for the metal fill 33. In other embodiments, the metal fill 33 may be composed of copper (Cu), aluminum (Al), platinum (Pt), titanium (Ti), silver (Ag), gold (Au) or an alloy or multi-layered combination of the aforementioned electrically conductive metals.

In one embodiment, the second device contact 35 is composed of a titanium oxide layer 34, a titanium metal layer 36, and a tungsten fill 33 that completely fills the second via opening 29, in which the titanium oxide layer 34 is in direct contact with a phosphorus doped n-type silicon source/drain region.

Figure 2A:
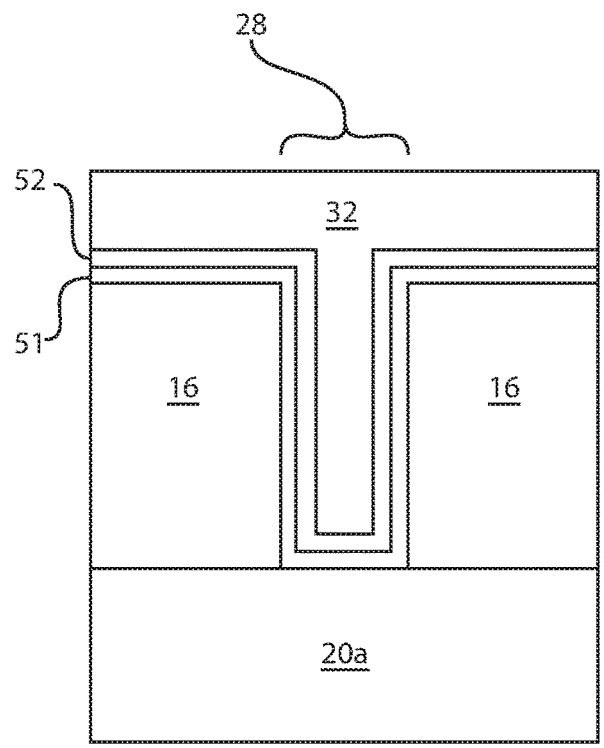
FIG. 2A is a side cross-sectional view of a first via opening to at least one of a source region or drain region of a semiconductor device composed of silicon and germanium, wherein the first via opening is filled with a material stack comprising a titanium layer atop the surface of the source or drain region, an aluminum layer atop the titanium layer, and a tungsten fill, in accordance with one embodiment of the present disclosure.
Figure 2B:
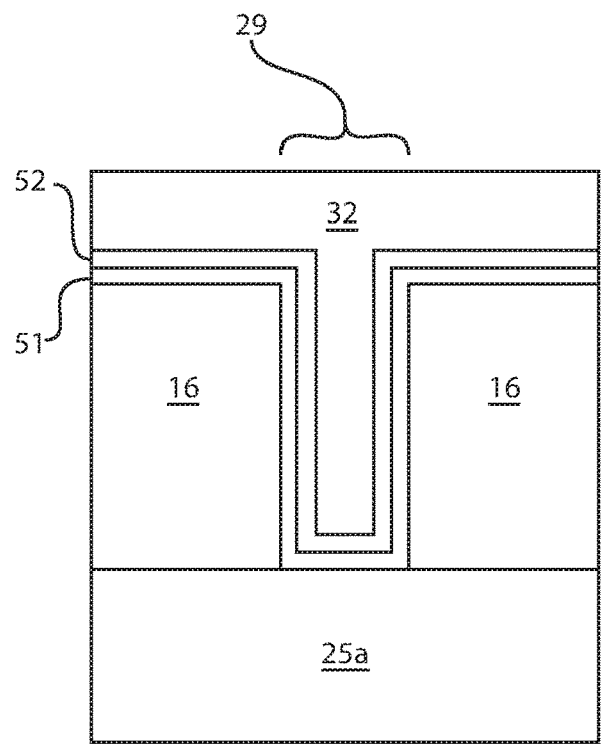
FIG. 2B is a side cross-sectional view of a second via opening to at least one of a source region or drain region a semiconductor device that is composed of silicon, wherein the second via opening is filled with a material stack comprising a titanium layer atop the surface of the source or drain region, an aluminum layer atop the titanium layer, and a tungsten fill, in accordance with one embodiment of the present disclosure.

Further details regarding the structure depicted in FIG. 1 may now be described detail with reference to FIGS. 2A-8B, which describe at least some steps for implementing one embodiment of the hybrid contact liner scheme for forming the first and second device contacts 30, 35 depicted in FIG. 1. For the purposes of simplicity FIGS. 2A-8B illustrate only the first and second via openings 28, 29 of the structure depicted in FIG. 1, as well as some steps for forming the first and second device contacts 30, 35. Although the first and second via openings are depicted in separate views throughout FIGS. 2A-8B, the depicted method steps are to be implemented in via openings to devices on the same substrate substantially simultaneously. FIGS. 2A-2B also illustrate the process steps for forming the contact to the source regions 20a, 25a of the first and second semiconductor device 50a, 50b. The illustrations (and related descriptions) provided for forming the contacts to the source regions 20a, 25a are equally suitable for forming the contacts to the drain regions 20a, 25a.

FIG. 2A depicts a first contact via 28 to at least one of a source region 20a of a semiconductor device 50a composed of silicon and germanium, e.g., silicon germanium (SiGe), wherein the first contact via 28 is filled with a material stack comprising a titanium layer 51 atop the surface of the source region 20a, an aluminum layer 52 atop the titanium layer 51, and a tungsten fill 32. FIG. 2B depicts a second contact via 29 to at least one of a source region 25a of a semiconductor device 50b that is composed of silicon, wherein the second contact via 29 is filled with a material stack comprising a titanium layer 51 atop the surface of the source region 35a, an aluminum layer 52 atop the titanium layer 51, and a tungsten fill 32. In some embodiments, at this stage of the present disclosure the titanium layer 51, the aluminum layer 52 and the tungsten fill 32 that is present in the first contact via 28 is the same as the titanium layer 51, the aluminum layer 52 and the tungsten fill 32 that is present in the second contact via 29. The source regions 20a, 25a including the composition and conductivity type have been described above in the description of the first and second semiconductor devices 50a, 50b that are depicted in FIG. 1. Further, the interlevel dielectric 16, as well as the first and second via opening 28, 29, that are depicted in FIGS. 2A and 2B have been described above in the description of the first and second semiconductor devices 50a, 50b that are depicted in FIG. 1.

Referring to FIGS. 2A and 2B, the titanium layer 51 may be composed substantially entirely of titanium. For example, the titanium layer 51 may be greater than 95 wt. % titanium (Ti). In other embodiments, the titanium layer 51 may be equal to 99 wt. % titanium (Ti) or greater, e.g., the titanium layer 51 can be 100 wt. % titanium. The titanium layer 51 may be a continuous layer that is formed on the sidewalls and base of the first and second via openings 28, 29. For example, the titanium layer 51 may be formed direct on a surface of the source and drain regions 20a, 20b, 25a, 25b of the semiconductor devices 50a, 50b at the base of the first and second via openings 28, 29. The titanium layer 51 may also extend from the first and second via openings 28, 29 atop an upper surface of the interlevel dielectric 16. In some embodiments, the titanium layer 51 may be a single material layer that is present in each of the first and second via openings 28, 29 and extends across the upper surfaces of the interlevel dielectric 16 between the adjacent first and second via openings 28, 29 to each of the first and second semiconductor devices 50a, 50b in a continuous fashion. The titanium layer 51 may be a conformally deposited layer having a thickness ranging from 1 nm to 10 nm. In some embodiments, the titanium layer 51 has a thickness ranging from 2 nm to 5 nm. In one example, the titanium layer 51 has a thickness of 3 nm. The titanium layer 51 may be deposited using a deposition method, such as physical vapor deposition (PVD), chemical vapor deposition (CVD) or atomic layer deposition. (ALD). Examples of PVD suitable for forming the titanium layer 51 include plating, electroplating, electroless plating, sputtering and combinations thereof. Examples of sputtering apparatus that may be suitable for depositing the titanium layer 51 include DC diode type systems, radio frequency (RF) sputtering, magnetron sputtering and ionized metal plasma (IMP) sputtering.

The aluminum layer 52 may be composed substantially entirely of aluminum. For example, the aluminum layer 52 may be greater than 95 wt. % titanium (Ti). In other embodiments, the aluminum layer 52 may be equal to 99 wt. % titanium (Ti) or greater, e.g., the aluminum layer 52 can be 100 wt. % aluminum. The aluminum layer 52 may be a continuous layer that is formed directly on the titanium layer 51 that is present on the sidewalls and base of the first and second via openings 28, 29. For example, the aluminum layer 52 may be formed directly on the titanium layer 51 that is present on a surface of the source and drain regions 20a, 20b, 25a, 25b of the semiconductor devices 50a, 50b at the base of the first and second via openings 28, 29. Similar to the titanium layer 51, the aluminum layer 52 may also extend from the first and second via openings 28, 29 atop an upper surface of the interlevel dielectric 16, e.g., the aluminum layer 52 being directly on the titanium layer 51 that is present on the upper surfaces of the interlevel dielectric 16. In some embodiments, the aluminum layer 52 may be a single material layer that is present in each of the first and second via openings 28, 29 and extends across the upper surfaces of the interlevel dielectric 16 between the adjacent first and second via openings 28, 29 to each of the first and second semiconductor devices 50a, 50b in a continuous fashion. The aluminum layer 52 may be a conformally deposited layer having a thickness ranging from 1 nm to 10 nm. In some embodiments, the aluminum layer 52 has a thickness ranging from 2 nm to 5 nm. In one example, the aluminum layer 52 has a thickness of 3 nm. The aluminum layer 52 may be deposited using a deposition method, such as physical vapor deposition (PVD), chemical vapor deposition (CVD) or atomic layer deposition. (ALD). Examples of PVD suitable for forming the aluminum layer 52 include plating, electroplating, electroless plating, sputtering and combinations thereof. Examples of sputtering apparatus that may be suitable for depositing the aluminum layer 52 include DC diode type systems, radio frequency (RF) sputtering, magnetron sputtering and ionized metal plasma (IMP) sputtering.

Still referring to FIGS. 2A and 2B, a metal fill 32 is formed on the material stack of the titanium layer 51 and the aluminum layer 52 in at least the first and second via openings 28, 29. The metal fill 32 provides the metal fill of the final first device contact 30 that is depicted in FIG. 1. The metal fill 32 is typically composed of tungsten (W). For example, the metal fill 32 may be composed substantially entirely of tungsten. For example, the metal fill 32 may be greater than 95 wt. % tungsten (W). In other embodiments, the metal fill 32 may be equal to 99 wt. % tungsten (W) or greater, e.g., the metal fill 32 can be 100 wt. % tungsten. Other metals that may be used for the metal fill 32 can include copper (Cu), gold (Au), silver (Ag), nickel (Ni) and alloys thereof, as well as alloys with tungsten (W). The metal fill 32 may be formed in direct contact with the aluminum layer 52. The metal fill 32 may be deposited to a thickness that at least fills the first and second via openings 28, 29. In some embodiments, the metal fill 32 may be a single material layer that is present in each of the first and second via openings 28, 29 and extends across the upper surfaces of the interlevel dielectric 16 between the adjacent first and second via openings 28, 29 to each of the first and second semiconductor devices 50a, 50b in a continuous fashion. The metal fill 32 may be deposited using a deposition method, such as physical vapor deposition (PVD), chemical vapor deposition (CVD) or atomic layer deposition (ALD). In one embodiment, the metal fill 32 is composed of tungsten that is deposited using chemical vapor deposition (CVD), in which the metal fill 32 has a height atop the first and second via openings 28, 29 of approximately 200 nm. Variations of CVD processes suitable for forming the metal fill 32 include, but are not limited to, Atmospheric Pressure CVD (APCVD), Low Pressure CVD (LPCVD) and Plasma Enhanced CVD (PECVD), Metal-Organic CVD (MOCVD) and combinations thereof may also be employed.

Following deposition, the metal fill 32 may be planarized. For example, the metal fill 32 may be planarized using chemical mechanical planarization (CMP). In one embodiment, following planarization, the height of the metal fill 32, e.g., tungsten (W) metal fill 32, as measured from the upper surface of the first and second via openings 28 may be 50 nm or less.

Figure 3A:
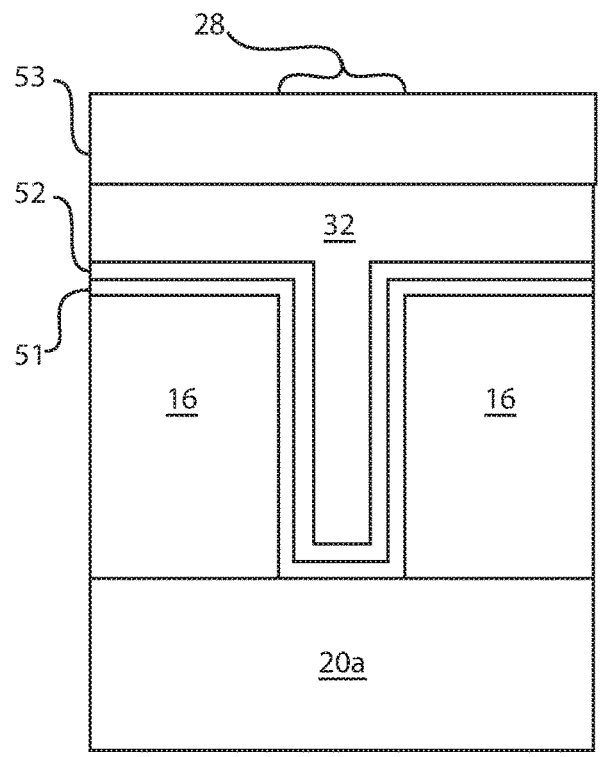
FIG. 3A is a side-cross sectional view depicting forming a block mask over the first via opening that is depicted in FIG. 2A.

FIG. 3A depicts forming a block mask 53 over the first contact via 28 that is depicted in FIG. 2A. The block mask 53 may comprise soft and/or hardmask materials and can be formed using deposition, photolithography and etching. In one embodiment, the block mask comprises an organic planarization layer (OPL). The organic planarization layer (OPL) may be a photo-sensitive organic polymer comprising a light-sensitive material that, when exposed to electromagnetic (EM) radiation, is chemically altered and thus configured to be removed using a developing solvent. For example, the photo-sensitive organic polymer may be polyacrylate resin, epoxy resin, phenol resin, polyamide resin, polyimide resin, unsaturated polyester resin, polyphenylenether resin, polyphenylenesulfide resin, or benzocyclobutene (BCB). The organic planarization layer (OPL) may be referred to as a photoresist layer, and a block mask 53 composed of a photoresist material may be referred to as a photoresist block mask. A photoresist block mask can be produced by applying a photoresist layer, exposing the photoresist layer to a pattern of radiation, and then developing the pattern into the photoresist layer utilizing conventional resist developer. Typically, the block masks 53 have a thickness ranging from 100 nm to 300 nm. The block mask 53 is formed overlying the first via opening 28 protecting the portion of the metal fill 32, aluminum layer 52, and titanium layer 51 present therein, wherein the portion of the metal fill 32, aluminum layer 52, and titanium layer 51 that is not present in the first via opening 28 may not be covered by the block mask 53, and is therefore exposed.

Figure 3B:
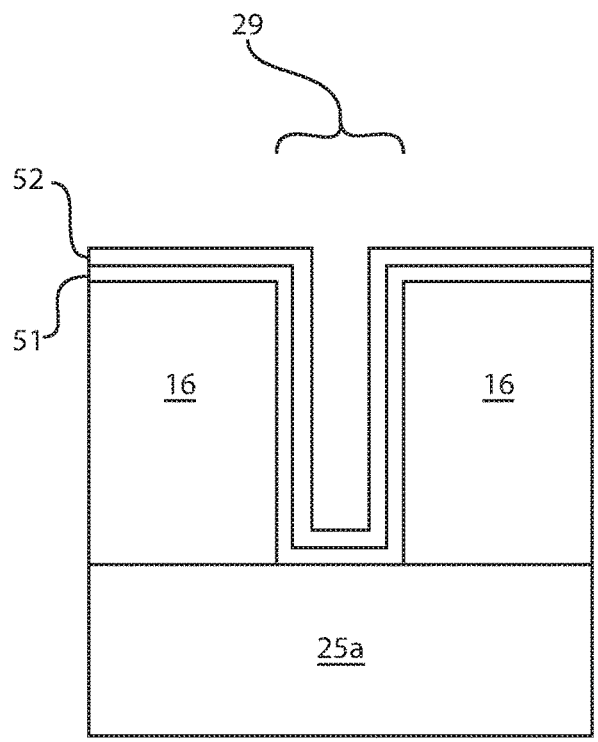
FIG. 3B is a side-cross sectional view depicting removing the first tungsten layer from the second contact via, while the block mask is present over the first contact via depicted in FIG. 3A.

FIG. 3B depicts removing the portion of the metal fill 32, e.g., tungsten (W) fill, that is present in the second via opening 29, while the block mask 53 is present over the first via opening 28 depicted in FIG. 3A. In some embodiments, the portion of the metal fill 32 that is present in the second via opening 29 is removed by an etch that is selective to the block mask 53 and the aluminum layer 52. The term "selective" as used in reference to a material removal process denotes that the rate of material removal for a first material is greater than the rate of removal for at least another material of the structure to which the material removal process is being applied. For example, in one embodiment, a selective etch may include an etch chemistry that removes a first material selectively to a second material by a ratio of 100:1 or greater, e.g., 1000:1. The etch process for forming the portion of the metal fill 32 that is present in the second via opening 29 may be an anisotropic etch process. As used herein, an "anisotropic etch process" denotes a material removal process in which the etch rate in the direction normal to the surface to be etched is greater than in the direction parallel to the surface to be etched. The anisotropic etch may include reactive-ion etching (RIE). For example, when the metal fill 32 is composed of tungsten, one reactive etch chemistry used with RIE that can remove the metal fill 32 selectively to the aluminum layer 52 and the block mask 53 may be an $SF_6$ based chemistry. Other examples of anisotropic etching that can be used at this point of the present disclosure include ion beam etching, plasma etching or laser ablation. The etch process may also be timed and/or employ end point detection methods to determine when the etch process has reached and exposed a surface of the aluminum layer 51.

In another example, the metal fill 32 may be removed by a wet etch that removes the metal fill 32 selectively to the block mask 53 and the aluminum layer 52. In one embodiment, in which the metal fill 32 is composed of tungsten (W), the wet etch chemistry for removing the tungsten metal fill 32 may be $NH_4OH:H_2O_2:H_2O$ in a ratio of 1:1.5:50 that is applied at a temperature ranging from 20° C. to 25° C.

Figure 4A:
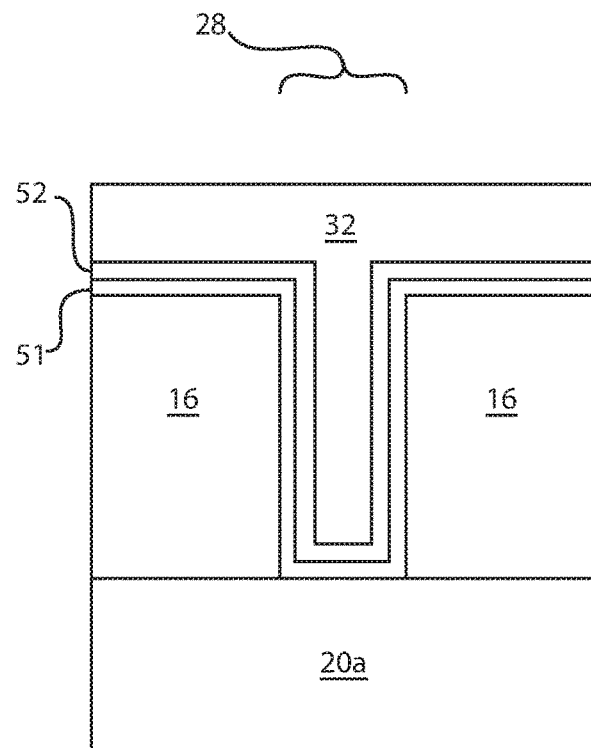
FIG. 4A is a side-cross sectional view depicting stripping the block mask from covering the first contact via after the tungsten fill has been removed from the second contact via, in accordance with one embodiment of the present disclosure.
Figure 4B:
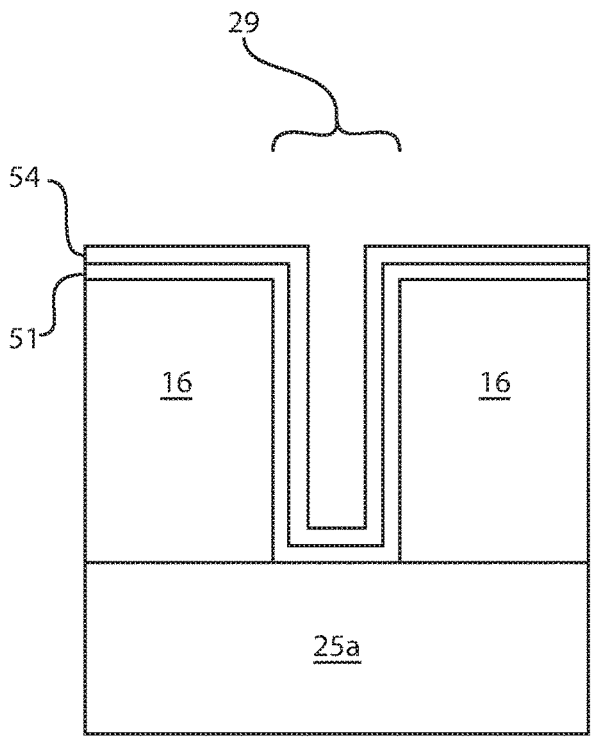
FIG. 4B is a side-cross sectional view depicting one embodiment of converting the aluminum layer of the first material stack within the second via opening to aluminum oxide, in accordance with one embodiment of the present disclosure.

FIG. 4B further depicts converting the aluminum layer 52 within the second via opening 29 to an oxide containing metal 54, e.g., aluminum oxide ($Al_2O_3$). Converting the aluminum layer 52 to a metal oxide layer 54, e.g., aluminum oxide, allows for the metal oxide layer 54 to be removed by an etch process that is selective to the underlying titanium layer 51. In some embodiments, the conversion of the aluminum layer into the first dielectric metal-containing compound portion 32A can be performed by plasma oxidation, in which an oxygen-containing plasma oxidizes the aluminum layer into a metal oxide material. The plasma oxidation can employ a plasma of oxygen or ozone within a pressure range from 0.1 mTorr to 10 mTorr, although lesser and greater pressures can also be employed. In other embodiments, the aluminum layer may be converted into an aluminum oxide layer 54 by thermal oxidation. Thermal oxidation may include annealing in an oxygen containing atmosphere. In one embodiment, the oxygen-containing atmosphere may include one or more oxygen containing gases, such as molecular oxygen ($O_2$), ozone ($O_3$), water vapor ($H_2O$), an nitrogen-oxides (NO, $NO_2$, etc.), among other oxygen-containing gases. The oxygen-containing atmosphere may also include radical oxygen and hydroxyl species such as atomic oxygen (O), hydroxides (OH), etc., that may be generated remotely and transported into the substrate chamber. Ions of oxygen-containing species may also be present. During the conversion process, the thermal annealing process temperature may range from about 25° C. to about 1100° C. (e.g., about 200° C., about 300° C., about 400° C., about 500° C., about 600° C., about 700° C., about 800° C., about 900° C., about 1000° C., etc.).

Following etching to remove the metal fill 32 from the second via opening 29, and conversion of the aluminum layer 51 to a metal oxide 54, the block mask 35 may be removed using selective etching, chemical stripping or oxygen ashing, as depicted in FIGS. 4A and 4B.

Figure 5A:
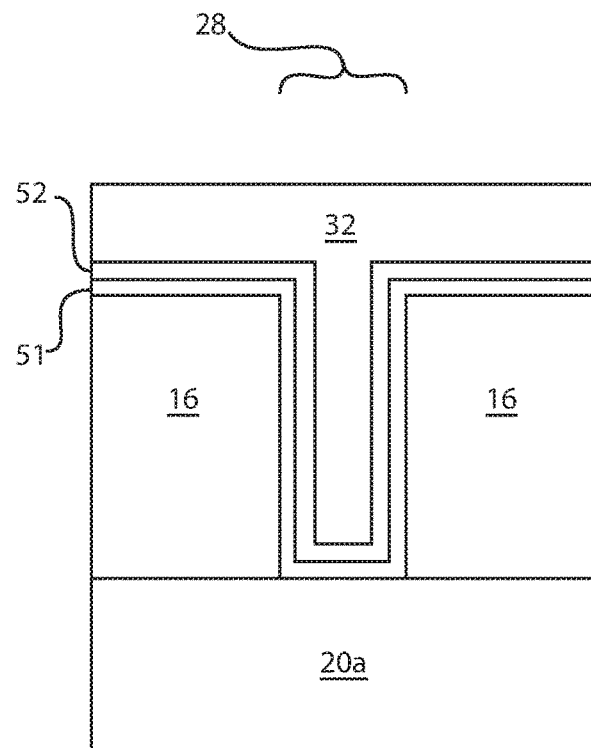
FIG. 5A is a side cross-sectional view depicting the first contact via, while the aluminum oxide layer in the second via opening is removed selectively to at least the titanium layer.
Figure 5B:
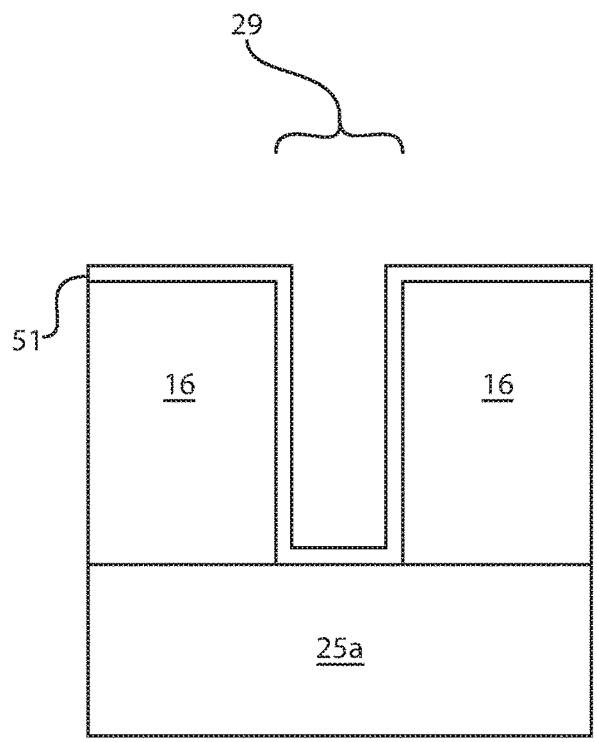
FIG. 5B is a side cross-sectional view depicting removing the aluminum oxide layer selectively to the titanium layer, in accordance with one embodiment of the present disclosure.

FIGS. 5A and 5B depict removing the metal oxide layer 54, e.g., aluminum oxide layer, from the second via opening 29 with an etch that is selective to the titanium layer 51 that is present in the second via opening 29. The etch process for removing the metal oxide layer 54, e.g., aluminum oxide layer, may be selective to the titanium layer 51 in the second via opening 29, as well as the remaining portion of the metal fill 32, e.g., tungsten (W) metal fill, that is present atop the first via opening 28. In some embodiments, the etch process for removing the metal oxide layer 54 may be an isotropic etch, which is a substantially non-directional etch. For example, the etch process for removing the metal oxide layer 54 may be provided by a wet chemical etch. In one embodiment, in which the metal oxide layer 54 is composed of aluminum oxide ($Al_2O_3$) layer selectively to the titanium layer 51 may be a wet etch comprising $NH_4OH:H_2O$ at a ratio ranging from 1:10 to 1:300 at a temperature ranging from 25° C. to 65° C. In another embodiment, the wet etch for removing the aluminum oxide layer, i.e., the metal oxide layer 54, selectively to the titanium layer 51 may include tera-methyl-ammonium hydroxide ($C_4H_{13}NO$), which can be diluted TMAH. It is noted that the titanium layer 51 remains within the second via opening 29 on the sidewalls of the second via opening 29 and the base of the second via opening 29 at this stage of the process sequence. The presence to the titanium layer 51 within the second via opening 29 minimizes trench widening, i.e., increasing the width of the second via opening 29.

Figure 6A:
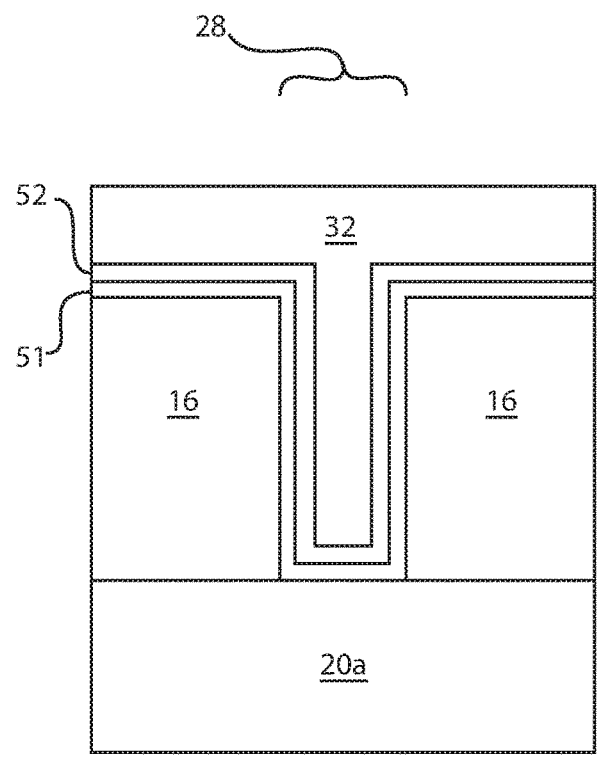
FIG. 6A is a side cross-sectional view depicting alloying one embodiment of the aluminum from the aluminum layer and the titanium from the titanium layer with silicon from the silicon and germanium including source and rain region in the first contact via, while the titanium layer in the second contact via is being converted to titanium oxide with an oxidation anneal.
Figure 6B:
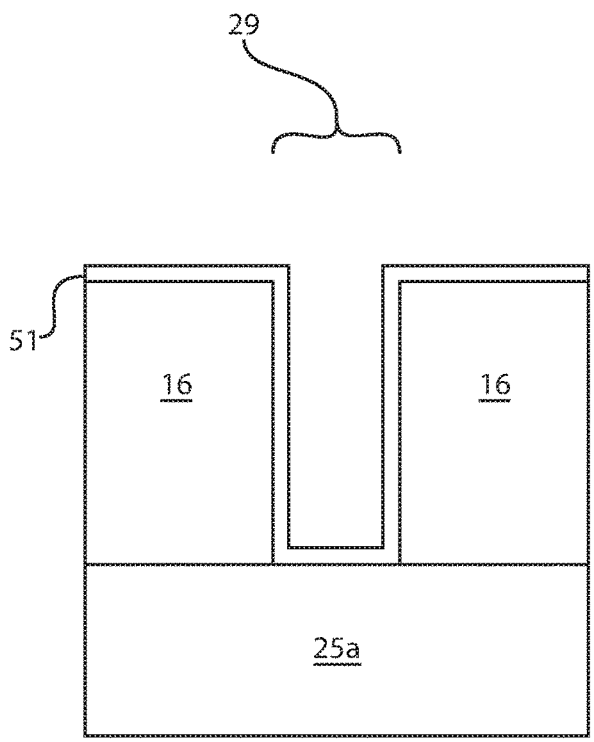
FIG. 6B is a side cross-sectional view depicting converting the titanium layer present in the second via to titanium oxide with an oxidation anneal, in accordance with one embodiment of the present disclosure.

FIGS. 6A and 6B depict one embodiment of treating the structure depicted in FIGS. 5A and 5B with a thermal anneal. FIG. 6A depict the alloying of the aluminum (Al) from the aluminum layer 52 and the titanium (Ti) from the titanium layer 51 with silicon from the silicon and germanium including source and rain regions 20a, 20b, 25a, 25b in the first via opening 28. The alloying results from thermal diffusion that occurs during treatment of the structures depicted in FIGS. 6A and 6B with the thermal anneal. The alloying of the aluminum (Al) from the aluminum layer 52 and the titanium (Ti) from the titanium layer 51 with silicon from the silicon and germanium including source and rain regions 20a, 20b, 25a, 25b produces the metal liner 31 of an aluminum, titanium and silicon alloy at a base of the first device contact 20 that is described above with reference to FIG. 1. Therefore, further details regarding the alloying of the aluminum (Al) from the aluminum layer 52 and the titanium (Ti) from the titanium layer 51 with silicon from the silicon and germanium including source and rain regions 20a, 20b, 25a, 25b to provide the metal liner 31, such as the composition of the metal liner 31, are provided above in the description of FIG. 1.

FIG. 6B depicts converting the titanium layer 51 that is present in the second via opening 29 to a titanium oxide layer 34 with a thermal anneal including an oxidizing atmosphere, which may also be referred to as a thermal oxidation anneal. The application of the thermal oxidation anneal to the titanium layer 51 in the second via opening 29 may provide the thermal annealing to alloy of the aluminum (Al) from the aluminum layer 52 and the titanium (Ti) from the titanium layer 51 with silicon from the silicon and germanium including source and rain regions 20a, 20b, 25a, 25b to produce the metal liner 31 at a base of the first device contact 20. Further details regarding the titanium oxide layer 34 depicted in FIG. 6B are provided above by the description of the titanium oxide layer 34 that is depicted in FIG. 1.

In one embodiment, the thermal anneal used to form the metal liner 31 in the first via opening 28 and the titanium oxide layer 34 in the second via opening 29 may include an oxygen-containing atmosphere. In some examples, the oxygen containing atmosphere of the thermal anneal may include one or more oxygen containing gases, such as molecular oxygen ($O_2$), ozone ($O_3$), water vapor ($H_2O$), an nitrogen-oxides (NO, $NO_2$, etc.), among other oxygen-containing gases. The oxygen-containing atmosphere may also include radical oxygen and hydroxyl species such as atomic oxygen (O), hydroxides (OH), etc., that may be generated remotely and transported into the substrate chamber. Ions of oxygen-containing species may also be present. The temperature of the thermal annealing process used to form the metal liner 31 in the first via opening 28 and the titanium oxide layer 34 in the second via opening 29 may range from about 25° C. to about 1100° C. (e.g., about 200° C., about 300° C., about 400° C., about 500° C., about 600° C., about 700° C., about 800° C., about 900° C., about 1000° C., etc.).

Figure 7A:
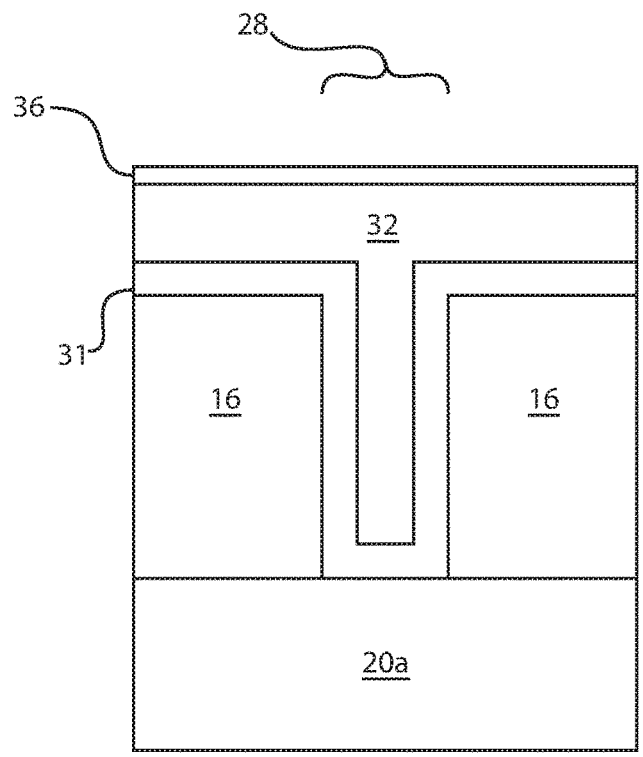
FIG. 7A is a side cross-sectional view depicting the first contact via, while a metal layer is being deposited in the second via opening directly on the titanium oxide layer.
Figure 7B:
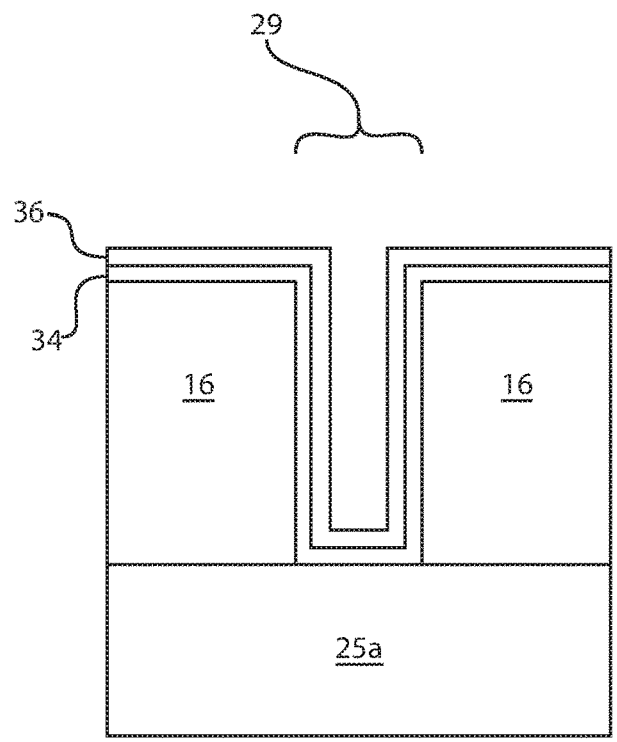
FIG. 7B is a side cross-sectional view of the second via opening depicting one embodiment of forming a metal layer on a titanium oxide layer, in accordance with the present disclosure.

FIGS. 7A and 7B depicting the first contact via, while a metal layer 36 is being deposited in the second via opening 29 directly on the titanium oxide layer 34. In some embodiments, the metal layer 36 comprises titanium (Ti). For example, the metal layer 36 may be composed of greater than 95 wt. % titanium (Ti). In other embodiments, the metal layer 36 may be equal to 99 wt. % titanium (Ti) or greater, e.g., the metal layer 36 can be 100 wt. % titanium. The metal layer 36 may be a continuous layer that is formed on the sidewalls and base of the second via opening 29. For example, the metal layer 36 may be formed directly on the titanium oxide layer 34 that is present on the surface of the source and drain regions 25a, 25b of the second semiconductor device 50b. The metal layer 36 may also be formed directly on the titanium oxide layer 34 that is present on the sidewalls of the second via opening 29. The metal layer 36 may be a blanket deposited layer. Therefore, a portion of the metal layer 36 may be present atop the remaining portion of the metal fill 32 that is present in the first via opening 28. The metal layer 36 may be a conformally deposited layer having a thickness ranging from 1 nm to 10 nm. In some embodiments, the metal layer 36 has a thickness ranging from 2 nm to 5 nm. In one example, the metal layer 36 has a thickness of 3 nm. The metal layer 36 may be deposited using a deposition method, such as physical vapor deposition (PVD), chemical vapor deposition (CVD) or atomic layer deposition. (ALD). Examples of PVD suitable for forming the metal layer 36 include plating, electroplating, electroless plating, sputtering and combinations thereof. Examples of sputtering apparatus that may be suitable for depositing the metal layer 36 include DC diode type systems, radio frequency (RF) sputtering, magnetron sputtering and ionized metal plasma (IMP) sputtering.

Figure 8A:
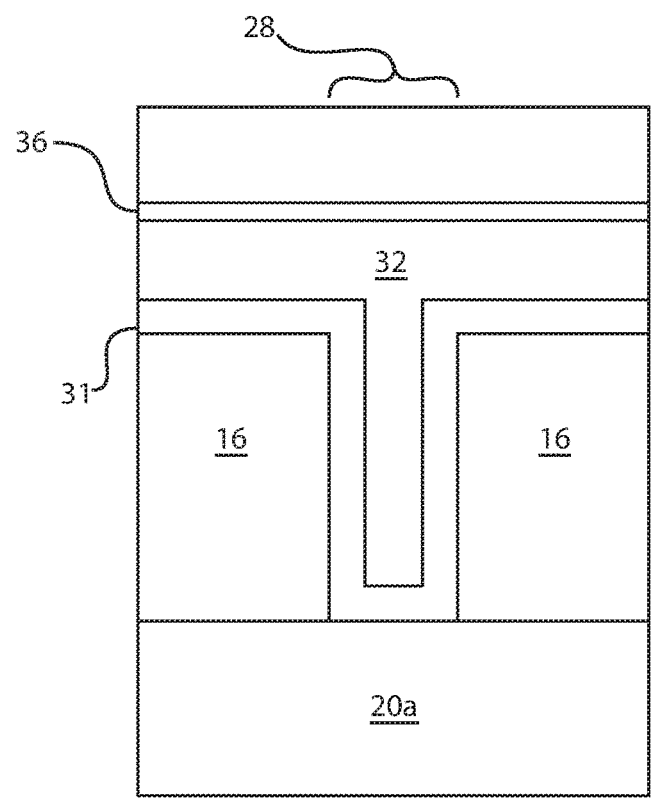
FIG. 8A is a side cross-sectional view depicting depositing a metal fill atop the first via opening, in accordance with one embodiment of the present disclosure.
Figure 8B:
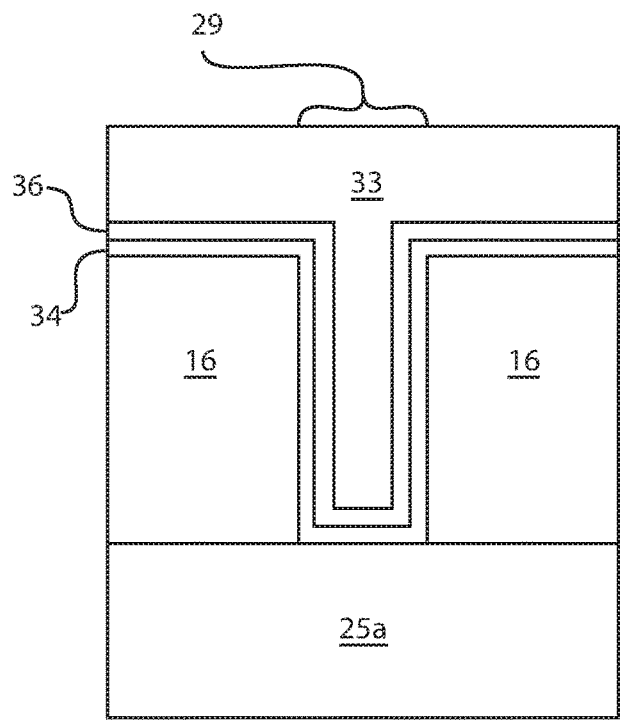
FIG. 8B is a side cross-sectional view depicting depositing a tungsten fill within the second via opening, in accordance with one embodiment of the present disclosure.

FIGS. 8A and 8B depict depositing a metal fill 33 atop the structures depicted in FIGS. 7A and 7B. The metal fill 33 may be deposited to fill the second via openings 29. The metal fill 33 provides the metal fill 33 of the final second device contact 35 that is depicted in FIG. 1. The metal fill 33 is typically composed of tungsten (W). For example, the metal fill 33 may be composed substantially entirely of tungsten. For example, the metal fill 33 may be greater than 95 wt. % tungsten (W). In other embodiments, the metal fill 33 may be equal to 99 wt. % tungsten (W) or greater, e.g., the metal fill 33 can be 100 wt. % tungsten. Other metals that may be used for the metal fill 33 can include copper (Cu), gold (Au), silver (Ag), nickel (Ni) and alloys thereof, as well as alloys with tungsten (W). The metal fill 33 may be formed in direct contact with the metal layer 36 that is present in the second via opening 29. The metal fill 33 may be deposited to a thickness that at least fills the second via opening 29. In some embodiments, the metal fill 33 may be a single material layer that fills the second via opening 29 and extends across over the upper surfaces of the interlevel dielectric 16 between the adjacent first and second via openings 28, 29 to also cover, i.e., overly, the first via opening 28, in which the metal fill 33 is in direct contact with the metal layer 36. The metal fill 33 may be deposited using a deposition method, such as physical vapor deposition (PVD), chemical vapor deposition (CVD) or atomic layer deposition (ALD). Variations of CVD processes suitable for forming the metal fill 33 include, but are not limited to, Atmospheric Pressure CVD (APCVD), Low Pressure CVD (LPCVD) and Plasma Enhanced CVD (PECVD), Metal-Organic CVD (MOCVD) and combinations thereof may also be employed.

Following deposition, the metal fill 33 may be planarized. For example, the metal fill 32 may be planarized using chemical mechanical planarization (CMP). In one embodiment, the planarization process continues until an upper surface of the interlevel dielectric 16 is exposed. The planarization process may remove the portions of the metal fill 33 and the metal liner 36 that are overlying the first via opening 28 to provide the first device contact 30 and the second device contact 35 that are depicted in FIG. 1.

The methods and structures that have been described above with reference to FIGS. 1-7 may be employed in any electrical device including integrated circuit chips. The integrated circuit chips including the disclosed structures and formed using the disclosed methods may be integrated with other chips, discrete circuit elements, and/or other signal processing devices as part of either (a) an intermediate product, such as a motherboard, or (b) an end product. The end product can be any product that includes integrated circuit chips, including computer products or devices having a display, a keyboard or other input device, and a central processor.

While the methods and structures of the present disclosure have been particularly shown and described with respect to preferred embodiments thereof, it will be understood by those skilled in the art that the foregoing and other changes in forms and details may be made without departing from the spirit and scope of the present disclosure. It is therefore intended that the present disclosure not be limited to the exact forms and details described and illustrated, but fall within the scope of the appended claims.

What is claimed is:

1. An electrical device comprising:
a first semiconductor device present in a first region of a substrate, the first semiconductor device including a silicon and germanium containing source and drain region;
a dielectric layer formed over the source and drain region; and
a device contact formed through the dielectric layer to the silicon and germanium containing source and drain region of the first semiconductor device, the device contact including a metal liner of a binary metal and silicon alloy at a base of the device contact, and a first tungsten fill, wherein an aluminum content of the metal liner is greater than 30%.

2. The electrical device of claim 1, wherein the silicon and germanium containing source and drain region of the first semiconductor device comprise a p-type conductivity.

3. The electrical device of claim 2, wherein the binary metal and silicon alloy at the base of the device contact forms a silicide with a surface of the silicon and germanium containing source and drain region of the first semiconductor device.

4. The electrical device of claim 2 further comprising a second semiconductor device in a second region of the semiconductor substrate, wherein a source and drain region of the second semiconductor device comprises an n-type dopant.

5. The electrical device of claim 4, wherein at least one of a p-type dopant and the n-type dopant is present in a concentration ranging from $1 \times 10^{19}$ dopants/cm$^3$ to $1 \times 10^{21}$ dopants/cm$^3$.

6. The electrical device of claim 1, wherein the binary metal includes titanium.

7. An electrical device comprising:
a p-type semiconductor device present in a first region of a substrate, the p-type semiconductor device including a silicon and germanium containing source and drain region;
an n-type semiconductor device in a second region of the substrate;
a dielectric layer formed over the source and drain region;
a first device contact formed through the dielectric layer to said silicon and germanium containing source and drain region of the p-type semiconductor device, the first device contact including a metal liner of a binary metal and a silicon alloy at the base of the first device contact, and a first tungsten fill, wherein an aluminum content of the metal liner is greater than 30%; and
a second device contact to a source and drain region of the n-type semiconductor device, the second device contact including a titanium oxide liner in contact with the source and drain of the n-type semiconductor device, a titanium metal liner on the titanium oxide liner, and a second tungsten fill on the titanium metal liner.

8. The electrical device of claim 7, wherein the binary metal and silicon alloy at the base of the first device contact forms a silicide with a surface of the silicon and germanium containing source and drain region of the first semiconductor device.

9. The electrical device of claim 7, wherein at least one of a p-type dopant and a n-type dopant is present in a concentration ranging from $1 \times 10^{19}$ dopants/cm$^3$ to $1 \times 10^{21}$ dopants/cm$^3$.

* * * * *